United States Patent
Chang et al.

(10) Patent No.: US 8,828,754 B2
(45) Date of Patent: Sep. 9, 2014

(54) METHOD FOR MANUFACTURING LED

(71) Applicant: Advanced Optoelectronic Technology, Inc., Hsinchu Hsien (TW)

(72) Inventors: Chieh-Ling Chang, Hsinchu (TW); Hsing-Fen Lo, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/865,163

(22) Filed: Apr. 17, 2013

(65) Prior Publication Data

US 2013/0288408 A1 Oct. 31, 2013

(30) Foreign Application Priority Data

Apr. 27, 2012 (CN) .......................... 2012 1 0127471

(51) Int. Cl.
*H01L 33/50* (2010.01)

(52) U.S. Cl.
USPC .......................................................... 438/27

(58) Field of Classification Search
USPC .......................................................... 438/27
See application file for complete search history.

(56) References Cited

U.S. PATENT DOCUMENTS

| | | | |
|---|---|---|---|
| 2010/0330714 A1* | 12/2010 | Jung et al. | 438/26 |
| 2011/0089455 A1* | 4/2011 | Diana et al. | 257/98 |
| 2012/0007130 A1* | 1/2012 | Hoelen et al. | 257/98 |
| 2012/0104435 A1* | 5/2012 | Lee et al. | 257/98 |
| 2012/0113621 A1* | 5/2012 | Lee et al. | 362/97.1 |
| 2012/0299018 A1* | 11/2012 | Chen et al. | 257/88 |

FOREIGN PATENT DOCUMENTS

CN 100592538 C * 2/2010

* cited by examiner

*Primary Examiner* — Asok K Sarkar
(74) *Attorney, Agent, or Firm* — Novak Druce Connolly Bove + Quigg LLP

(57) ABSTRACT

A method for manufacturing an LED includes steps: providing a base and an LED chip disposed on the base; providing an optical element and disposing the optical element on the base to cover the LED chip; providing a phosphor film and disposing the phosphor film on the optical element; providing a holding plate with capillary holes and disposing the base on the holding plate; providing a mold, wherein the mold and the holding plate cooperatively form a receiving room which receives the base, the LED chip, the optical element and the phosphor film therein; extracting air from the receiving room through the capillary holes of the holding plate, and/or, blowing air toward the phosphor film, whereby the phosphor film is conformably attached onto the optical element; and solidifying the phosphor film on the optical element.

15 Claims, 11 Drawing Sheets

METHOD FOR MANUFACTURING LED

BACKGROUND

1. Technical Field

The disclosure relates a method for manufacturing an LED (light emitting diode), and particularly to a method for manufacturing an LED which has a phosphor film containing fluorescent powders uniformly distributed therein.

2. Discussion of Related Art

Light emitting diodes' (LEDs) many advantages, such as high luminosity, low operational voltage, low power consumption, compatibility with integrated circuits, easy driving, long term reliability, and environmental friendliness have promoted their wide use as a lighting source.

A typical LED includes a base, first and second electrodes secured to the base, an LED chip arranged on the base and electrically connected to the first and second electrodes, and an encapsulation structure encapsulating the LED chip. To improve light emission characteristic of the LED, a large number of fluorescent powders are mixed into glue, before the glue is dispensed on the LED chip to form the encapsulation structure. However, the fluorescent powders may deposit in the glue during the period when the glue is solidified, which results in an uneven distribution of the fluorescent powders in the solidified glue, and adversely accordingly influences light emission effect of the LED.

Therefore, what is needed is a method for manufacturing an LED which can overcome the described limitations.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the present light emitting diode package for microminiaturization. Moreover, in the drawing, like reference numerals designate corresponding parts throughout the whole view.

DETAILED DESCRIPTION OF EMBODIMENTS

A method for manufacturing an LED in accordance with a first embodiment is provided, which includes the following steps.

Figure 1:
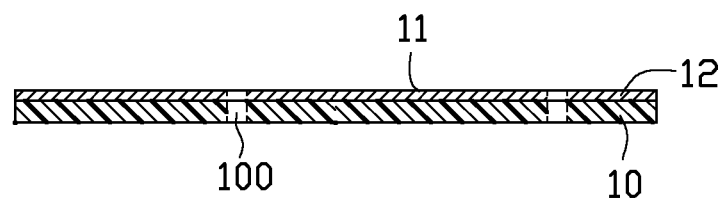
FIGS. 1-10 are schematic views showing steps of a method for manufacturing an LED, in accordance with a first embodiment of the present disclosure.
Figure 2:
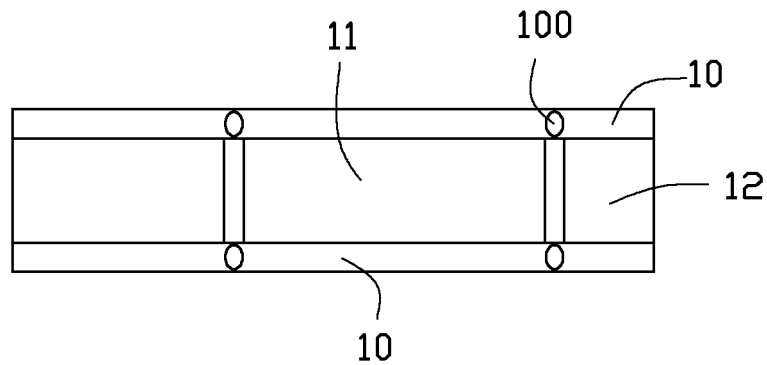

The first step is to provide a base 10 (referring to FIGS. 1-2, FIG. 1 shows a cross-sectional view of the base 10, FIG. 2 shows a top plan view of the base 10). The base 10 defines a plurality of through holes 100. A first electrical connection portion 11 and a second electrical connection portion 12 are arranged on a top face of the base 10. The first electrical connection portion 11 and the second electrical connection portion 12 are spaced from each other, and electrically insulating regions (not labeled) are formed between the first electrical connection portion 11 and the second electrical connection portion 12. The through holes 100 are located at two opposite ends of the electrically insulating regions, respectively.

Figure 3:
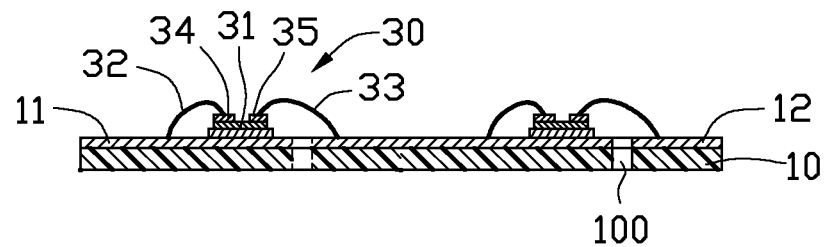
Figure 4:
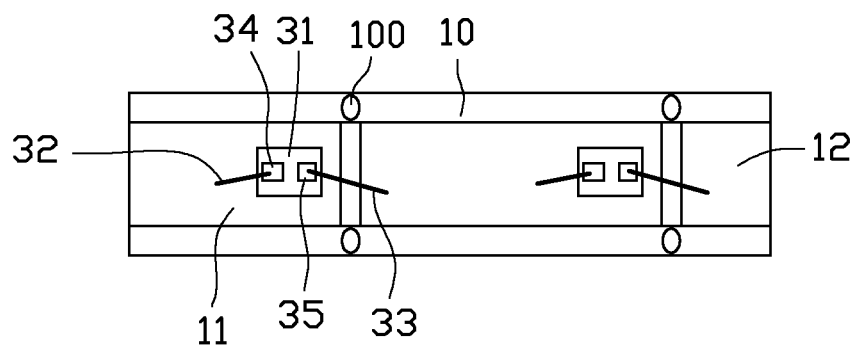

The second step is to provide a plurality of LED chips 30 and arrange the LED chips 30 on the base 10 (referring to FIGS. 3-4, FIG. 3 shows a cross-sectional view of the LED chips 30 arranged on the base 10, FIG. 4 shows a top plan view of the LED chips 30 arranged on the base 10). The LED chips 30 are fixed on top faces of the first electrical connection portion 11 and the second electrical connection portion 12. Each LED chip 30 includes a light emitting structure 31, and first and second electrodes 34, 35 both disposed on a top face of the light emitting structure 31 far from the base 10. The first electrode 34 is electrically connected to the first electrical connection portion 11 via a conductive wire 32. The second electrode 35 is electrically connected to the second electrical connection portion 12 via a conductive wire 33.

Figure 5:
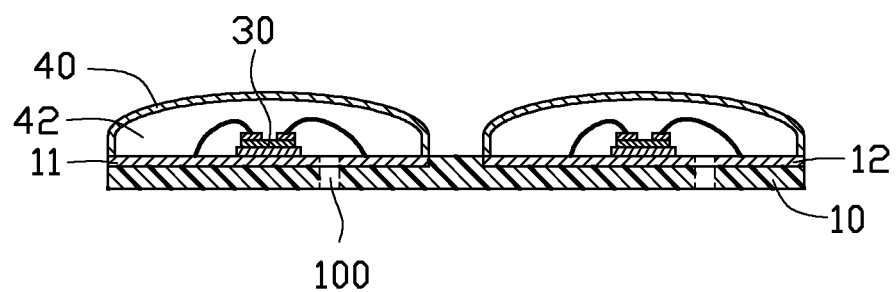
Figure 6:
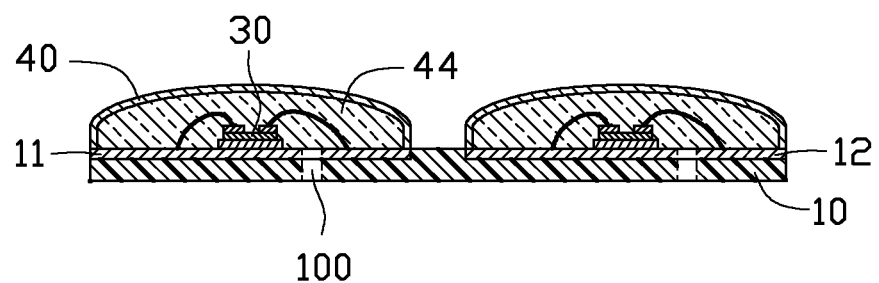

Referring to FIGS. 5-6, the third step is to provide a plurality of optical elements and dispose the optical elements on the base 10 to cover the LED chips 30, respectively. In this embodiment, a plurality of lenses 40 are used to function as the optical elements. A filling space 42 is formed between each lens 40 and the base 10. Encapsulation material is filled into each filling space 42 through the through holes 100, whereby an encapsulation layer 44 is formed between each lens 40 and the base 10 to encapsulate the LED chip 30.

Figure 7:
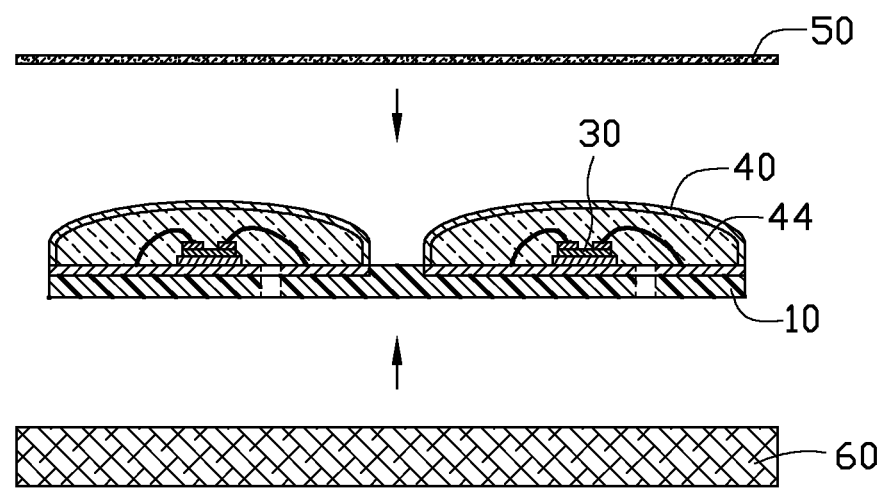

Referring to FIG. 7, the fourth step is to provide a phosphor film 50 and place the phosphor film 50 on the lenses 40. The phosphor film 50 contains fluorescent powders uniformly distributed therein. A material for the fluorescent powders preferably is garnet, for example, yttrium aluminum garnet (YAG). In this step, the phosphor film 50 placed on the lenses 40 is in a semi-solidified state. Since the phosphor film 50 is in the semi-solidified state, the fluorescent powders will not deposit easily; therefore, the fluorescent powders can be kept as being uniformly distributed in the phosphor film 50 before and after the phosphor film 50 is solidified.

The fifth step is to provide a holding plate 60 having a plurality of capillary holes, and place the base 10 on the holding plate 60. The capillary holes extend through top and bottom faces of the holding plate 60. The holding plate 60 is larger than the base 10 in area.

Figure 8:
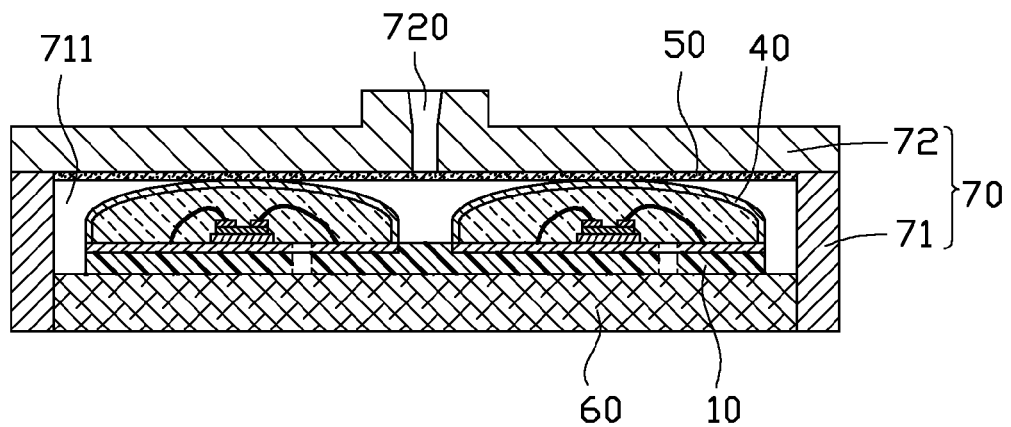

Referring to FIG. 8, the sixth step is to provide a mold 70, wherein the mold 70 and the holding plate 60 cooperatively form a receiving room 711 therebetween; the base 10, the LED chips 30, the lenses 40 and the phosphor film 50 are all received in the receiving room 711. The mold 70 includes a bottom die 71 and an upper die 72. The bottom die 71 surrounds a periphery of the holding plate 60. The upper die 72 lies above the bottom die 71. A top face of the bottom die 71 is coplanar with an upper face of the phosphor film 50. A bottom face of the upper die 72 contacts the top face of the bottom die 71 and the upper face of the phosphor film 50. The upper die 72 defines a through hole 720 in a center thereof. The through hole 720 communicates with the receiving room 711.

Figure 9:
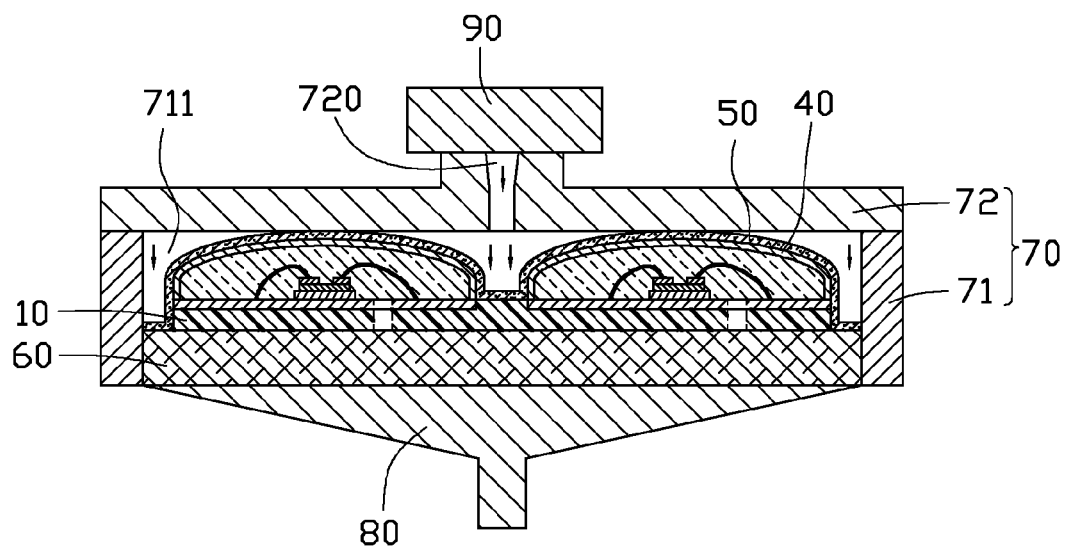

Referring to FIG. 9, the seventh step is to extract air from the receiving room 711 through the capillary holes of the holding plate 60, and/or, blow air toward the phosphor film 50 through the through hole 720, whereby the phosphor film 50 is deformed to be conformably attached onto the lenses 40. Specifically, a vacuum device 80 is provided. The vacuum device 80 abuts against a bottom face of the holding plate 60 to extract the air in the receiving room 711, so that the air flows out of the receiving room 711 through the capillary holes of the holding plate 60. A pressurizing device 90 is provided to connect with the through hole 720 of the upper die 72. The pressurizing device 90 blows air toward the phosphor film 50 through the through hole 720 of the upper die 72. In practice, an intimate attachment of the phosphor film 50 onto the top faces of the lenses 40 can be achieved by using only one of the vacuum device 80 and the pressurizing device 90, or both simultaneously.

Figure 10:
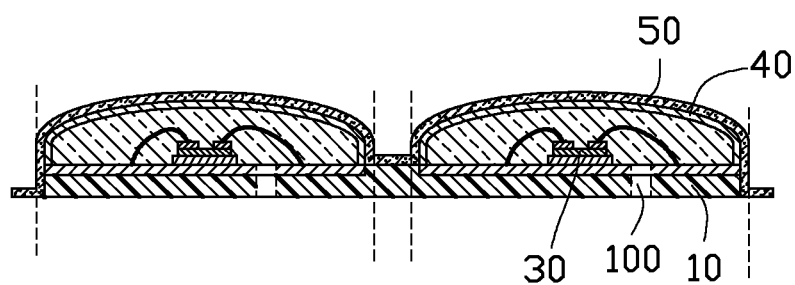

The eighth step is to solidify the phosphor film 50 on the lenses 40. Specifically, the vacuum device 80, the pressurizing device 90, the mold 70 and the holding plate 60 are removed firstly; then the phosphor film 50 is solidified on the lenses 40 by means of heating the semi-solidified phosphor film 50 at a raised temperature. Alternatively, the vacuum device 80, the pressurizing device 90, the mold 70 and the holding plate 60 can be removed after the phosphor film 50 is solidified on the lenses 40 by means of heating the phosphor film 50. Finally, the LEDs connected together are cut off along dotted lines of FIG. 10 to obtain a plurality of individual LEDs.

According to the disclosure of the method for manufacturing the LED, the phosphor film 50 is initially attached onto the lenses 40 by extracting air from the receiving room 711 through the capillary holes of the holding plate 60 and/or blowing air toward the phosphor film 50, and then solidified on the lenses 40. The phosphor film 50 attached onto the lenses 40 is in the semi-solidified state before solidified on the lenses 40, which ensures that the fluorescent powders can be uniformly distributed in the phosphor film 50 when the phosphor film 50 is solidified.

Figure 11:
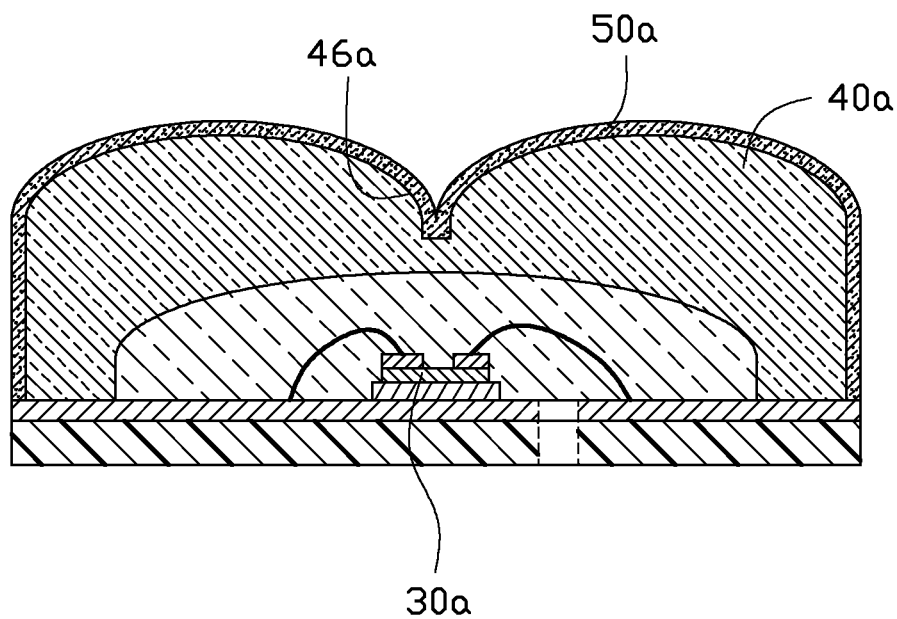
FIG. 11 shows an LED manufactured by a method in accordance with a second embodiment of the present disclosure.

FIG. 11 shows an LED obtained by a method for manufacturing an LED in accordance with a second embodiment. The differences between the method in the second embodiment and the method in the first embodiment are in that: the method in the second embodiment employs a lens 40a; the lens 40a has a concave face 46a in a center of an external face thereof, so that a light pattern with "bat wing" shape can be formed after light emitted from an LED chip 30a runs through the lens 40a. A phosphor film 50a is attached onto the lens 40a by extracting air and/or blowing air towards the phosphor film 50a, and then solidified on the lens 40a.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A method for manufacturing an LED (light emitting diode), comprising following steps:
   providing a base and an LED chip, and disposing the LED chip on the base;
   providing an optical element and disposing the optical element on the base to cover the LED chip;
   providing a phosphor film and placing the phosphor film on the optical element;
   providing a holding plate having a plurality of capillary holes and disposing the base on the holding plate;
   providing a mold, wherein the mold and the holding plate cooperatively form a receiving room therebetween, and the base, the LED chip, the optical element and the phosphor film are all received in the receiving room;
   extracting air from the receiving room through the capillary holes of the holding plate, and/or, blowing air towards the phosphor film, whereby the phosphor film is conformably attached onto the optical element; and
   solidifying the phosphor film on the optical element.

2. The method of claim 1, wherein a vacuum device is provided, the vacuum device abutting against a bottom face of the holding plate to extract the air in the receiving room, the air being extracted out of the receiving room through the capillary holes of the holding plate.

3. The method of claim 2, wherein a pressurizing device is provided, the mold defining a through hole to communicate with the receiving room, the pressurizing device being connected with the through hole of the mold, the pressurizing device blowing air towards the phosphor film through the through hole of the mold.

4. The method of claim 3, wherein the mold comprises a bottom die and an upper die, the bottom die surrounding a periphery of the holding plate, the upper die lying above the bottom die, the through hole being defined in the upper die.

5. The method of claim 4, wherein a top face of the bottom die is coplanar with an upper face of the phosphor film, a bottom face of the upper die contacting the top face of the bottom die and the upper face of the phosphor film.

6. The method of claim 3, wherein the step of solidifying the phosphor film on the optical element is performed after the vacuum device, the pressurizing device, the mold and the holding plate are removed, and the phosphor film is solidified on the optical element by means of heating the phosphor film at a raised temperature.

7. The method of claim 3, further comprising a step of removing the vacuum device, the pressurizing device, the mold and the holding plate after the step of solidifying the phosphor film on the optical element, wherein the step of solidifying the phosphor film is performed by means of heating the phosphor film at a raised temperature.

8. The method of claim 1, wherein the optical element is a lens, and the lens has a concave face in a center of an external face thereof.

9. The method of claim 1, wherein the base defines a plurality of through holes, a filling space being formed between the optical element and the base, encapsulation material being filled into the filling space through the through holes of the base to form an encapsulation layer.

10. The method of claim 1, wherein a pressurizing device is provided, the mold defining a through hole to communicate with the receiving room, the pressurizing device being connected with the through hole of the mold, the pressurizing device blowing air towards the phosphor film through the through hole of the mold.

11. The method of claim 10, wherein the mold comprises a bottom die and an upper die, the bottom die surrounding a periphery of the holding plate, the upper die lying above the bottom die, the through hole being defined in the upper die.

12. The method of claim 11, wherein a top face of the bottom die is coplanar with an upper face of the phosphor film, a bottom face of the upper die contacting the top face of the bottom die and the upper face of the phosphor film.

13. The method of claim 10, wherein the step of solidifying the phosphor film on the optical element is performed after the vacuum device, the pressurizing device, the mold and the holding plate are removed, and the phosphor film is solidified on the optical element by means of heating the phosphor film at a raised temperature.

14. The method of claim 10, further comprising a step of removing the vacuum device, the pressurizing device, the mold and the holding plate after the step of solidifying the phosphor film on the optical element, wherein the step of solidifying the phosphor film is performed by means of heating the phosphor film at a raised temperature.

15. The method of claim 1, wherein the phosphor film contains fluorescent powders therein, the phosphor film placed on the optical element being in a semi-solidified state before solidified on the optical element.

* * * * *